United States Patent
Li et al.

(10) Patent No.: US 10,667,402 B2
(45) Date of Patent: May 26, 2020

(54) EMBEDDED CIRCUIT BOARD AND METHOD OF MAKING SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Yan-Lu Li, Guangdong (CN); Jun-Hua Wang, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/145,240

(22) Filed: Sep. 28, 2018

(65) Prior Publication Data

US 2020/0037450 A1    Jan. 30, 2020

(30) Foreign Application Priority Data

Jul. 27, 2018   (CN) .......................... 2018 1 0844385

(51) Int. Cl.
    *H05K 3/32*      (2006.01)
    *H05K 1/18*      (2006.01)
    (Continued)

(52) U.S. Cl.
    CPC ........... *H05K 1/186* (2013.01); *H05K 1/0298* (2013.01); *H05K 1/0393* (2013.01); *H05K 1/115* (2013.01);
    (Continued)

(58) Field of Classification Search
    CPC ........ H05K 3/4697; H05K 3/30; H05K 3/301; H05K 3/306; H05K 3/287; H05K 3/321; H05K 3/241; H05K 1/186; H05K 1/029; H05K 1/0393; H05K 1/115; Y10T 29/4913; Y10T 29/49146
    (Continued)

(56) References Cited

U.S. PATENT DOCUMENTS 8,901,724 B2 * 12/2014 Guzek ..................... H01L 24/19
                                                            257/686
2006/0060960 A1 * 3/2006 Cho ....................... H05K 1/183
                                                            257/700
(Continued)

*Primary Examiner* — Peter Dungba Vo
*Assistant Examiner* — Kaying Kue
(74) *Attorney, Agent, or Firm* — ScienBiziP, P.C.

(57) ABSTRACT

An embedded circuit board includes a circuit board including a flexible base layer, a first conductive circuit layer, a second conductive circuit layer, two adhesive layers, and two copper plates. The first conductive circuit layer and the second conductive circuit layer are formed on corresponding opposite base layer surfaces of the base layer and electrically interconnected together. A photosensitive layer is located on one surface of the circuit board. A component is located within a mounting slot formed within the photosensitive layer. Each copper plate includes a flexible insulating film and forms a third conductive circuit layer. The flexible insulating film is adhered to a corresponding one of the circuit board or the photosensitive material layer by a corresponding one of the adhesive layers.

4 Claims, 3 Drawing Sheets

(51) Int. Cl.
*H05K 1/02* (2006.01)
*H05K 1/03* (2006.01)
*H05K 1/11* (2006.01)
*H05K 3/28* (2006.01)
*H05K 3/24* (2006.01)

(52) U.S. Cl.
CPC ............. *H05K 3/241* (2013.01); *H05K 3/287* (2013.01); *H05K 3/321* (2013.01)

(58) Field of Classification Search
USPC .......................... 29/832, 841, 833–840, 852
See application file for complete search history.

(56) References Cited

U.S. PATENT DOCUMENTS

| | | | |
|---|---|---|---|
| 2006/0191711 A1* | 8/2006 | Cho | H01L 23/5389 174/260 |
| 2008/0102410 A1* | 5/2008 | Kim | H01L 21/4857 430/312 |
| 2009/0107708 A1* | 4/2009 | Takahashi | H05K 1/183 174/257 |
| 2012/0012371 A1* | 1/2012 | Kita | H01L 21/4857 174/255 |
| 2013/0219712 A1* | 8/2013 | Suzuki | H01L 24/19 29/841 |
| 2014/0048326 A1* | 2/2014 | Lin | H05K 9/00 174/377 |
| 2014/0092569 A1* | 4/2014 | Sakurai | H05K 3/4697 361/752 |
| 2014/0157593 A1* | 6/2014 | Lin | H01L 24/19 29/832 |
| 2016/0013123 A1* | 1/2016 | Pai | H01L 25/50 257/774 |
| 2016/0021749 A1* | 1/2016 | Bong | H05K 3/4007 174/260 |
| 2016/0219712 A1* | 7/2016 | Ko | H01L 24/00 |
| 2016/0374196 A1* | 12/2016 | Lee | H05K 3/4697 |
| 2017/0019989 A1* | 1/2017 | Lee | H05K 1/144 |
| 2017/0079142 A1* | 3/2017 | Lee | H05K 1/183 |

* cited by examiner

EMBEDDED CIRCUIT BOARD AND METHOD OF MAKING SAME

FIELD

The subject matter herein generally relates to circuit boards, and more particularly to a circuit board having a component embedded therein.

BACKGROUND

Generally, circuit boards of electronic devices are electrically coupled to components of the electronic device. The component takes up space of the electronic device.

Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
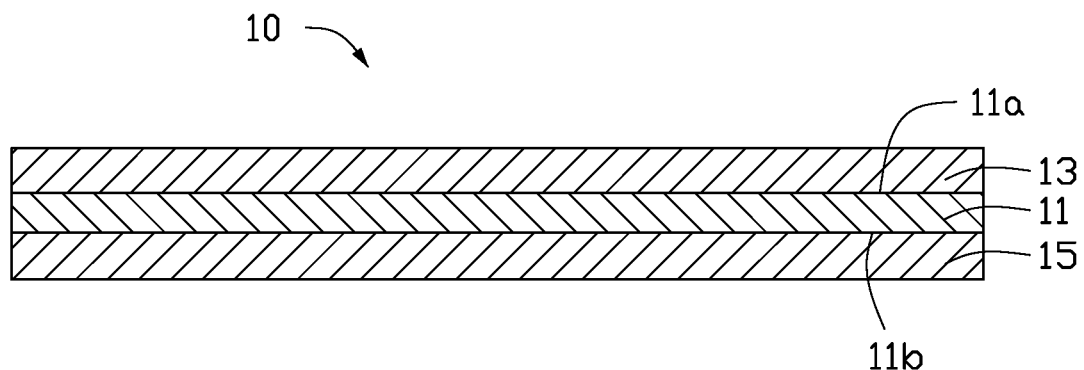
FIG. 1 is a cross-sectional view of an embodiment of a substrate of an embedded circuit board in accordance with the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIGS. 1-7 illustrate an embodiment of a method of making an embedded circuit board 100 having component 90 embedded therein.

FIG. 1 shows, in step S1, a substrate 10 is provided. The substrate 10 includes a flexible base layer 11, a first copper layer 13, and a second copper layer 15. The base layer 11 has opposite base layer surfaces 11a and 11b. The first copper layer 13 is formed on the base layer surface 11a, and the second copper layer 15 is formed on the base layer surface 11b.

A material of the base layer 11 is selected from one of polyimide, liquid crystal polymer, polyethylene terephthalate, polyethylene naphthalate, and any combination thereof.

Figure 2:
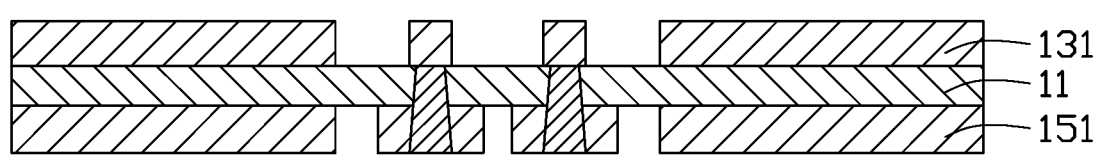
FIG. 2 is a cross-sectional view of the substrate in FIG. 1 after being processed to obtain a circuit board.

FIG. 2 shows, in step S2, the base layer 11 is drilled, electroplated, circuit configuration processed, and surface treated to form a first conductive circuit layer 131 and a second conductive circuit layer 151 from the first copper layer 13 and the second copper layer 15, respectively, thereby forming a circuit board 20.

After the first copper layer 13 and the second copper layer 15 are drilled, electroplated, circuit configuration processed, and surface treated, the first conductive circuit layer 131 and the second conductive circuit layer 151 are electrically interconnected together.

Figure 3:
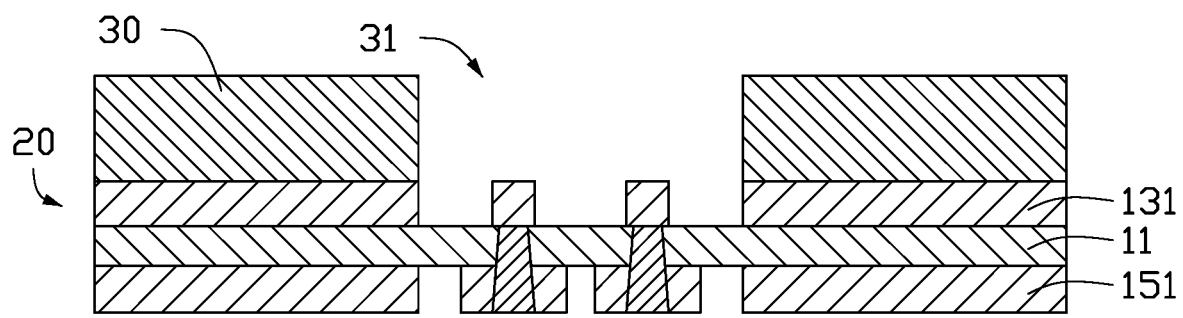
FIG. 3 is a cross-sectional view of the circuit board in FIG. 2 having a photosensitive material layer formed thereon.

FIG. 3 shows, in step S3, photosensitive material is formed onto a surface of the first conductive circuit layer 131 to form a photosensitive material layer 30. Portions of the photosensitive material layer 30 are selectively removed to form a mounting slot 31.

In at least one embodiment, the portions of the photosensitive material layer 30 are selectively removed by exposing to form the mounting slot 31, and UV solidifying and baking processes are used to fix the photosensitive material layer 30. An exposed portion of the mounting slot 31 accesses the first conductive circuit layer 131.

Figure 4:
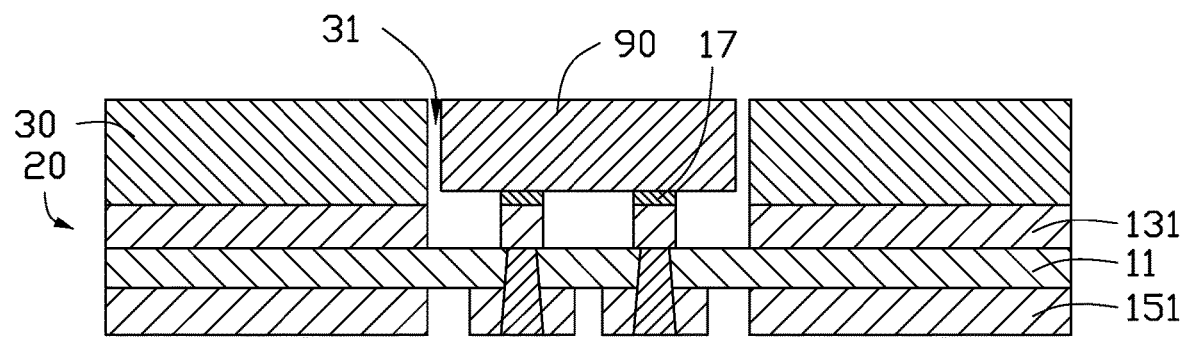
FIG. 4 is a cross-sectional view of the photosensitive material layer in FIG. 3 having a component received within a mounting slot formed in the photosensitive material layer.

As shown in FIG. 4, a width of the mounting slot 31 is greater than a width of the component 90 to be inserted in the slot 31, and a depth of the mounting slot 31 is greater than or equal to a thickness of the component 90 to be inserted in the slot 31.

FIG. 4 shows, in step S4, the component 90 is placed within the mounting slot 31 and spot-welded onto the first conductive circuit layer 131 and electrically coupled to the first conductive circuit layer 131. A surface of the first conductive circuit layer 131 may be surface-treated to prevent oxidation of the first conductive circuit layer 131. A surface treatment method may include chemical gilding, electrogilding, electroless tin plating, electrotinning, or the like for forming a protective layer 17. Otherwise, the first conductive circuit layer 131 may have an organic solderability preservative layer (OSP) (not shown) formed thereon.

In at least one embodiment, the component 90 is an IC chip. The component 90 may be a passive electronic component or an active electronic component.

Figure 5:
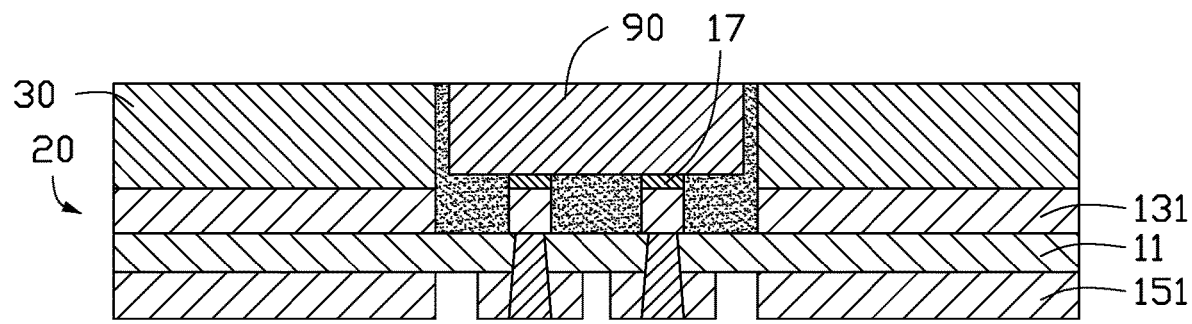
FIG. 5 is a cross-sectional view of the mounting slot in FIG. 4 having glue filled in the mounting slot.

FIG. 5 shows, in step S5, glue (speckled feature/not labeled) is provided in the mounting slot 31. The glue fills the mounting slot 31 and fixes the component 90 within the mounting slot 31.

The glue is provided within the mounting slot 31 to a level coplanar with an outer surface of the photosensitive material layer 30 to create a continuous surface.

Figure 6:
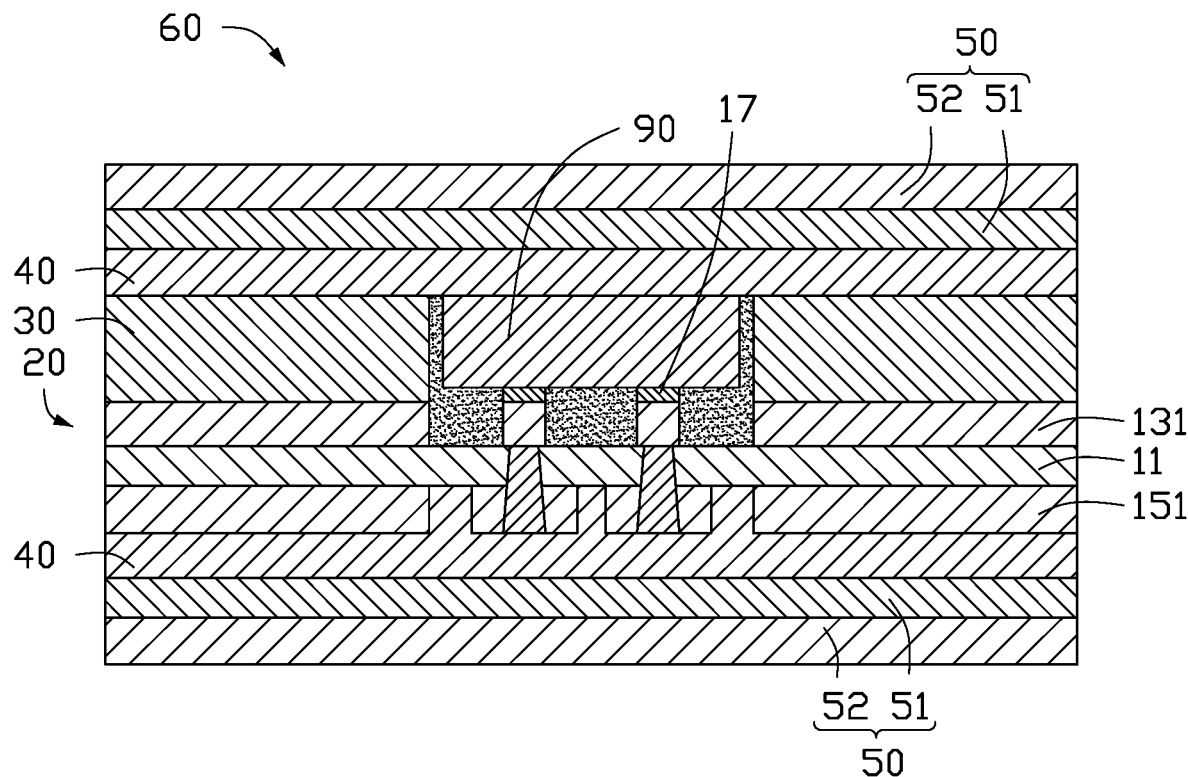
FIG. 6 is a cross-sectional view of the circuit board and the photosensitive material layer in FIG. 5 having an adhesive layer and a third copper layer formed onto the circuit board and the photosensitive material layer to obtain an embedded core material.

FIG. 6 shows, in step S6, two copper plates 50 are provided. A first copper plate 50 is formed by an adhesive layer 40 to an outer surface of the second conductive circuit layer 151, and a second copper plate 50 is formed by an adhesive layer 40 to the photosensitive material layer 30, thereby forming an embedded core material 60. The adhesive layer 40 is a plate-shaped adhesive layer.

In at least one embodiment, the adhesive layer 40 is made of adhesive resin. Specifically, material of the adhesive layer 40 is selected from at least one of polypropylene, epoxy resin, polyurethane, phenolic resin, urea resin, melamine-formaldehyde resin, and polyimide.

The copper plates 50 are flexible copper clad laminate (FCCL). The copper plates 50 may include a flexible insulating film 51 and a third copper layer 52.

The material of the flexible insulating film 51 is selected from one of polyimide, liquid crystal polymer, polyethylene terephthalate, and polyethylene naphthalate.

Figure 7:
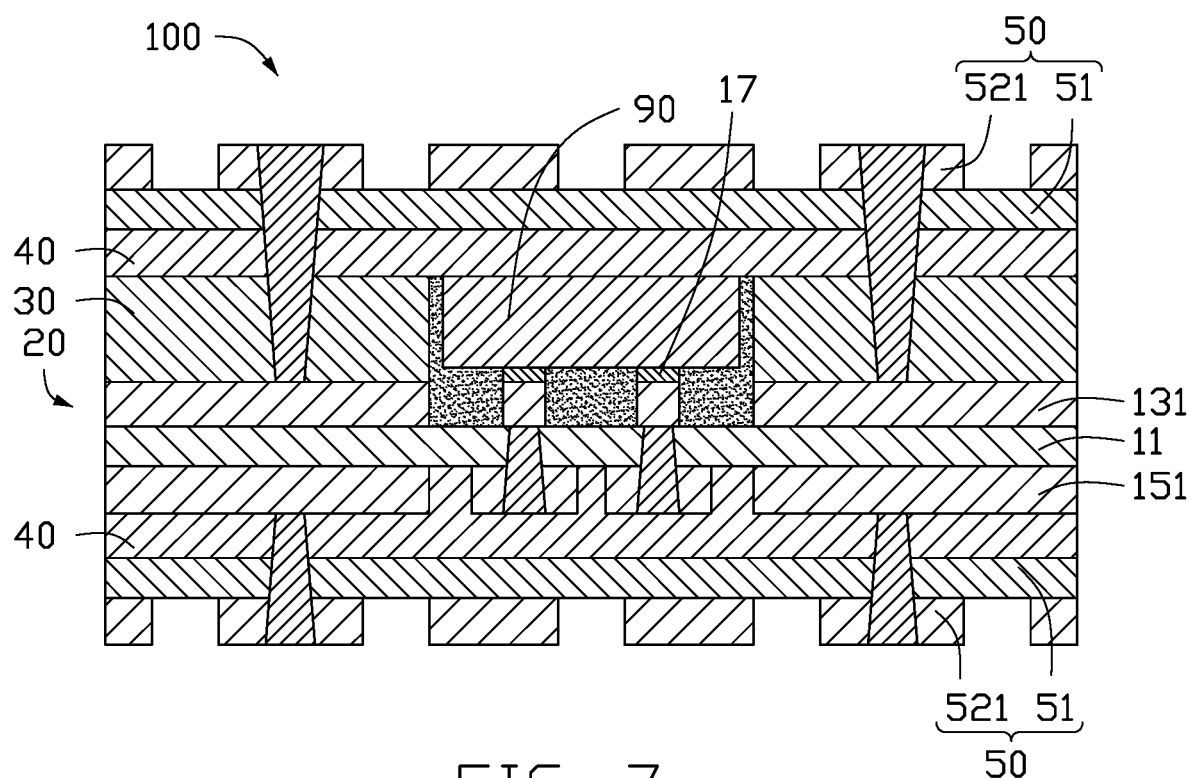
FIG. 7 is a cross-sectional view of the embedded core material in FIG. 6 further processed to obtain the embedded circuit board.

FIG. 7 shows, in step S7, the embedded core material 60 is drilled, electroplated, and circuit configuration processed to electrically interconnect the component 90, the circuit board 20, and two third conductive circuit layers 521 together, thereby forming the embedded circuit board 100. Each of the third conductive circuit layers 521 is formed from a corresponding one of the two third copper plates 52.

It should be understood that after step S7, steps S6 and S7 may be repeated on the third conductive circuit layers 521 to form an embedded circuit board 100 having multiple conductive circuit layers.

FIG. 7 shows, in at least one embodiment, the embedded circuit board 100 includes the circuit board 20, the photosensitive material layer 30 located on one side of the circuit board 20, the component 90 placed within the photosensitive material layer 30, the glue used to fix the component 90 within the photosensitive material layer 30, and the two adhesive layers 40 to form the two copper plates 50 to the surfaces of the circuit board 20 and the photosensitive material layer 30, respectively. The two copper plates 50 include the flexible insulating film 51 and the third conductive circuit layer 521.

The circuit board 20 includes the flexible base layer 11 and the first conductive circuit layer 131 and the second conductive circuit layer 151 formed on the opposite outer base layer surfaces 11a, 11b.

The photosensitive material layer 30 forms the mounting slot 31, and the mounting slot 31 receives the component 90 therein. The component 90 is electrically coupled to the first conductive circuit layer 131.

The flexible insulating film 51 is formed by the adhesive layer 40 to the outer surface of the circuit board 20 and the photosensitive material layer 30. The third conductive circuit layer 521 located on the flexible insulating film 51 is electrically coupled to the first conductive circuit layer 131 or the second conductive circuit layer 151.

The component 90 is received within the mounting slot 31, the mounting slot 31 is formed within the photosensitive material layer 30, and the photosensitive material layer 30 is formed on the circuit board 20. The photosensitive material layer 30 and the circuit board 20 are formed together to form the embedded circuit board 100. A depth of the mounting slot 31 is greater than or equal to a thickness of the component 90, so that the component 90 is not pressed during a formation process. Thus, the component 90 is protected from damage. A process of manufacture is simple, thereby reducing overhead costs.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method of making an embedded circuit board, the method comprising:
   providing a circuit board comprising a flexible base layer, a first conductive circuit layer, and a second conductive circuit layer, the first conductive circuit layer and the second conductive circuit layer formed on corresponding opposite surfaces of the flex base layer;
   forming a photosensitive material layer onto an outer surface of the first conductive circuit layer;
   selectively removing portions of the photosensitive material layer to form a mounting slot;
   placing a component within the mounting slot to be mounted on and electrically connected to the first conductive circuit layer;
   filling a glue in the mounting slot and the first conductive circuit layer to fix the component, wherein a thickness of the glue in a direction perpendicular to the flexible base layer is same as sum of thicknesses of the first conductive circuit layer and the photosensitive material layer, an outer surface of the glue away from the flexible base layer is level with an outer surface of the photosensitive material layer away from the flexible base layer;
   forming a first copper plate onto an outer surface of the second conductive circuit layer and forming a second copper plate onto the photosensitive material layer, wherein each of the first copper plate and the second copper plate is adhered corresponding to the outer surface by an adhesive layer, and each of the first copper plate and the second copper plate comprises a flexible insulating film and a third copper layer; and
   drilling, electroplating, and circuit configuration processing the circuit board to electrically interconnect the component, the circuit board, and two third conductive circuit layers together, wherein each of the two third conductive circuit layers formed from a corresponding one of the third copper layer of the first copper plate and the second copper plate.

2. The method of claim 1, wherein a material of the base layer is selected from one of polyimide, liquid crystal polymer, polyethylene terephthalate, polyethylene naphthalate, and any combination thereof.

3. The method of claim 1, wherein portions of the photosensitive material layer are selectively removed by exposing the portions of the photosensitive material layer to form the mounting slot, and then the photosensitive material layer is cured by UV solidifying and baking processes.

4. The method of claim 1, wherein a width of the mounting slot is greater than a width of the component to be received within the mounting slot, and a depth of the mounting slot is greater than or equal to a thickness of the component to be received within the mounting slot.

* * * * *